United States Patent
Harn et al.

(10) Patent No.: US 10,546,075 B2
(45) Date of Patent: Jan. 28, 2020

(54) SYSTEM AND METHOD FOR A SYNTHETIC TRACE MODEL

(71) Applicant: Futurewei Technologies, Inc., Plano, TX (US)

(72) Inventors: YwhPyng Harn, Milpitas, CA (US); Fa Yin, Shanghai (CN); Xiaotao Chen, Basking Ridge, NJ (US)

(73) Assignee: FUTUREWEI TECHNOLOGIES, INC., Plano, TX (US)

( * ) Notice: Subject to any disclaimer, the term of this patent is extended or adjusted under 35 U.S.C. 154(b) by 909 days.

(21) Appl. No.: 15/140,246

(22) Filed: Apr. 27, 2016

(65) Prior Publication Data

US 2016/0335379 A1 Nov. 17, 2016

Related U.S. Application Data

(60) Provisional application No. 62/162,523, filed on May 15, 2015.

(51) Int. Cl.
*G06F 17/50* (2006.01)
(52) U.S. Cl.
CPC .................. *G06F 17/5009* (2013.01)
(58) Field of Classification Search
CPC .................................................. G06F 17/5009
See application file for complete search history.

(56) References Cited

U.S. PATENT DOCUMENTS

| | | | |
|---|---|---|---|
| 7,496,735 B2 * | 2/2009 | Yourst | G06F 9/3808 712/216 |
| 7,692,686 B1 | 4/2010 | Cabot | |
| 2002/0199172 A1 * | 12/2002 | Bunnell | G06F 11/3466 717/128 |
| 2005/0251719 A1 | 11/2005 | Gerber et al. | |
| 2006/0224531 A1 * | 10/2006 | Abrahao | G06F 11/3414 706/15 |
| 2008/0098358 A1 * | 4/2008 | Shekov | G06F 11/3476 717/128 |

(Continued)

FOREIGN PATENT DOCUMENTS

| | | |
|---|---|---|
| CN | 1677365 A | 10/2005 |
| CN | 102426548 A | 4/2012 |

(Continued)

OTHER PUBLICATIONS

Agarwal et al., "An Analytical Cache Model," ACM Trans. on Computer Systems, vol. 7, Issue 2, May 1989, pp. 184-215.

(Continued)

*Primary Examiner* — Doon Y Chow
*Assistant Examiner* — Carina Yun
(74) *Attorney, Agent, or Firm* — Slater Matsil, LLP

(57) ABSTRACT

A system and method for a synthetic trace model includes providing a first system model, the first system model comprising a plurality of subsystem models, each of the plurality of subsystem models having a trace format, generating a first plurality of traces from an overall pool of trace instructions, each of the first plurality of traces generated for respective ones of the plurality of subsystem models, according to the trace format of the subsystem model, executing the traces on each of the subsystem models, and evaluating execution characteristics for each trace executed on the first system model.

23 Claims, 14 Drawing Sheets

(56) References Cited

U.S. PATENT DOCUMENTS

| | | | | |
|---|---|---|---|---|
| 2008/0126828 A1* | 5/2008 | Girouard | ............ | G06F 11/3644 |
| | | | | 714/2 |
| 2010/0257510 A1* | 10/2010 | Horley | ............... | G06F 11/3632 |
| | | | | 717/128 |
| 2016/0246465 A1* | 8/2016 | Nguyen | ............. | G06F 11/3414 |

FOREIGN PATENT DOCUMENTS

| CN | 103560829 A | 2/2014 |
|---|---|---|
| CN | 104216764 A | 12/2014 |

OTHER PUBLICATIONS

Heirman et al., "Synthetic Traffic Generation as a Tool for Dynamic Interconnect Evaluation," Proc. 2007 International Workshop on System Level Interconnect Prediction (SLIP'07), Mar. 17-18, 2007, ACM Press, pp. 65-72.

"ITG Common Sequence Layer Manual," Ver. 1.0, Jeda Technologies, Inc., Jun. 30, 2009, 86 pages.

"ITG Traffic Generator Control," Jeda Technologies, Inc., Jan. 20, 2010, 10 pages.

Joshi et al., "Performance Cloning: A Technique for Disseminating Proprietary Applications as Benchmarks," Proc. 2006 IEEE International Symposium on Workload Characterization (IISWC) Oct. 25-27, 2006, pp. 105-115.

Thiebaut et al., "Synthetic Traces for Trace-Driven Simulation of Cache Memories," IEEE Trans. Comput., vol. 41, Apr. 1992, pp. 388-410.

* cited by examiner

```
(1) 1 0x410 0x00 0x00 nop
    ccount 0x0
    load 0x800270 32
...
begin COF (1000) 1 0x410 0x00 0x00 nop
    ccount 1000
    load 0x800270 32

(1001) 1 0x413 0x00 0x00
    ccount 1001
    store 0x800280 32 0x1234abcd
...
#next COF
```

SYSTEM AND METHOD FOR A SYNTHETIC TRACE MODEL

This patent application claims priority to U.S. Provisional Application No. 62/162,523, filed on May 15, 2015, and titled "System and Method for a Synthetic Trace Model for System Simulation and Exploration," which is hereby incorporated by reference herein as if reproduced in its entirety.

TECHNICAL FIELD

The present invention relates generally to system simulation and exploration, and in particular embodiments, to techniques and mechanisms for a synthetic trace model.

BACKGROUND

Functionalities and capabilities of telecommunication systems have increased and expanded at a very fast pace. As power and convenience of telecommunication systems have increased, sophistication and complexity of systems have also increased. In addition to other design challenges, these increases have caused system verification to become a challenge. System verification ensures a system will function as expected, and also can be used to ensure a system will function as expected when the system architecture is expanded and new functionality is added. Simulation is a generally accepted approach to system verification.

SUMMARY OF THE INVENTION

Technical advantages are generally achieved by embodiments of this disclosure, which describe a system and method for a synthetic trace model.

In accordance with an embodiment, a method includes providing a first system model, the first system model comprising a plurality of subsystem models, each of the plurality of subsystem models having a trace format, generating a first plurality of traces from an overall pool of trace instructions, each of the first plurality of traces generated for respective ones of the plurality of subsystem models, according to the trace format of the subsystem model, executing the traces on each of the subsystem models, and evaluating execution characteristics for each trace executed on the first system model.

In accordance with an embodiment, a method includes providing a system model comprising a plurality of subsystem models, dividing an overall pool of trace instructions for the system model into a plurality of COF elements, each of the COF elements including a subset of the overall pool of trace instructions, each of the COF elements comprising a complete operation for one of the subsystem models, grouping the plurality of COF elements into a plurality of COF groups, each of the COF elements in a COF group starting with a same instruction memory address and including a same quantity of instructions, selecting at least one COF group of the plurality of COF groups, producing new COF elements by adding a random or deterministic offset to instructions or data memory addresses in the plurality of COF elements in the at least one COF group, combining the new COF elements to produce a new trace, and executing the new trace with the plurality of subsystem models.

In accordance with an embodiment, a device includes a processor, and a computer-readable storage medium storing a program to be executed by the processor, the program including instructions for providing a first system model, the first system model comprising a plurality of subsystem models, each of the plurality of subsystem models having a trace format, generating a first plurality of traces from an overall pool of trace instructions, each of the first plurality of traces generated for respective ones of the plurality of subsystem models, according to the trace format of the subsystem model, executing the traces on each of the subsystem models, and evaluating execution characteristics for each trace executed on the first system model.

In accordance with an embodiment, a device includes a processor, and a computer-readable storage medium storing a program to be executed by the processor, the program including instructions for providing a system model comprising a plurality of subsystem models, dividing an overall pool of trace instructions for the system model into a plurality of COF elements, each of the COF elements including a subset of the overall pool of trace instructions, each of the COF elements comprising a complete operation for one of the subsystem models, grouping the plurality of COF elements into a plurality of COF groups, each of the COF elements in a COF group starting with a same instruction memory address and including a same quantity of instructions, selecting at least one COF group of the plurality of COF groups, producing new COF elements by adding a random or deterministic offset to instructions or data memory addresses in the plurality of COF elements in the at least one COF group, combining the new COF elements to produce a new trace, and executing the new trace with the plurality of subsystem models.

BRIEF DESCRIPTION OF THE DRAWINGS

For a more complete understanding of the present invention, and the advantages thereof, reference is now made to the following descriptions taken in conjunction with the accompanying drawing, in which:

FIGS. 5-8 illustrate example traces;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1:
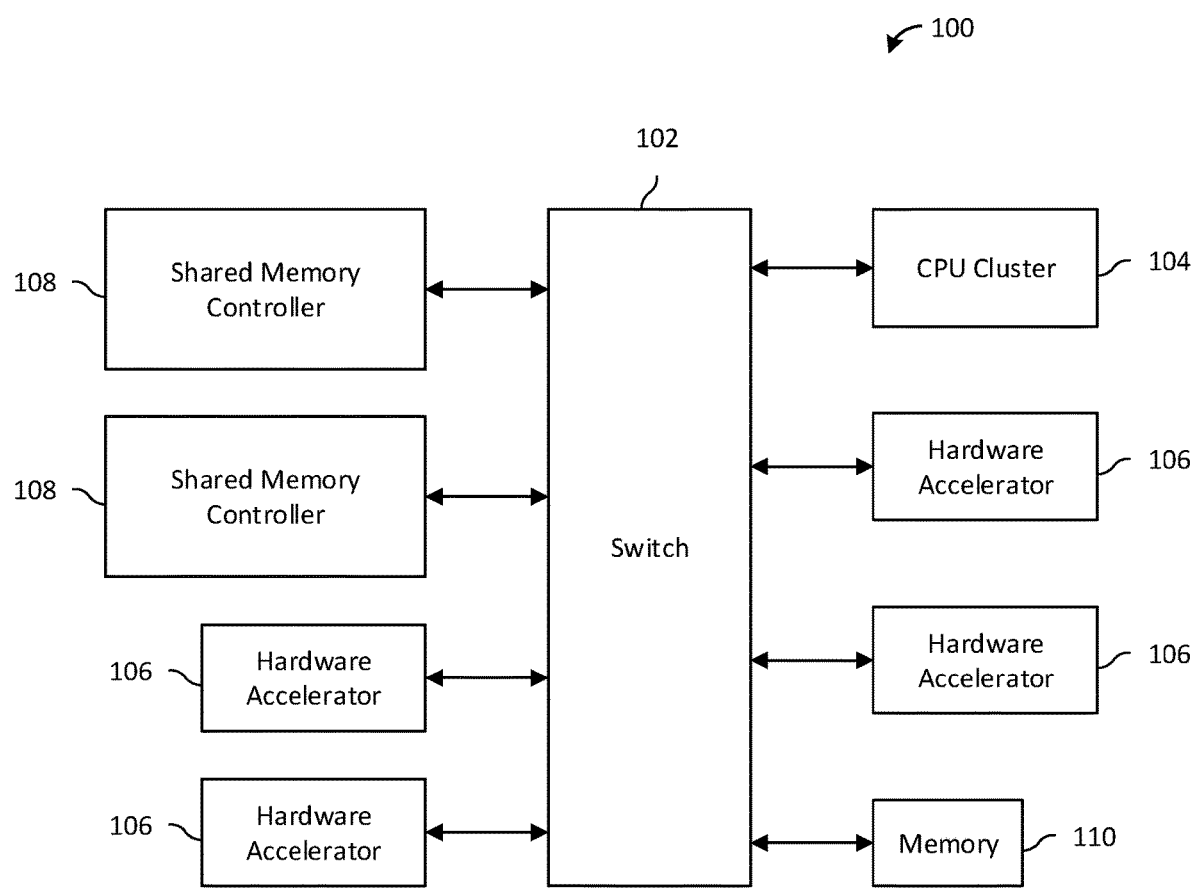
FIG. 1 is a model of a system.

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

Disclosed herein is a system and method for a synthetic trace model (STM) for simulating the functionality of systems, such as telecommunication systems. System-level information can be obtained through simulation, which can help determine feasibility of a system before the system is fully designed and implemented. System-level information can include information such as latency, throughput, cache miss rate, workload overhead, memory subsystem (MSS) utilization/contention, peak to average power ratio, and the like.

In various embodiments, blocks and interconnect protocols in the system to be explored are modeled, and system inputs (also called traces) are furnished for the simulation. Embodiments described herein duplicate, compress, modify, and create traces in an automated and systematic manner for simulation. Further, embodiments may generate traces that support synchronization among cores, as well as provide fuller and wider stress testing coverage for the system. Once the traces are created, the modeled system can be simulated using the traces. The simulation results can be used to explore bottlenecks and limits in the system before specific aspects of the system architecture, such as the interconnect configuration, are designed and implemented.

Various embodiments may achieve advantages. Traces are rarely available early in the design process for a new system, and available traces may lack variation, which can make multi-core and multi-thread design and verification difficult. Embodiments allow creation of new traces with greater variation. Existing traces can be very large, and thus may take a large amount of processing power and time to simulate, even when only a small amount of traffic-intensive areas in a system are of interest. Embodiments may allow reduction of trace sizes through compression, reducing the total amount of processing power needed to simulate a system. Traces may be unavailable until a new system is fully developed, at which point detected problems can be difficult to correct. As a result, traces for a testing a new system may be reused from an older model, and old traces may not properly test areas of interest in a newer system model. Embodiments allow creation and addition of traffic to traces that result in the generation of newer traces that more accurately reflect real-world use cases. Embodiments also allow creation of new traces based on primitive patterns, which can be used in new models, in corner cases, or in specific scenarios where traces would otherwise be unavailable. Embodiments also allow proper simulation of sequential dependency among multiple system cores, which is a common problem in real-world usage scenarios. Preset synchronization rules for the simulation may allow for a more meaningful simulation of multiple core dependency.

FIG. 1 is a model of a system 100. The system 100 includes a communications switch 102, a CPU cluster 104, hardware accelerators 106, shared memory controllers 108, and memory 110. The system 100 is an example of a relatively complex system. The communications switch 102 connects the devices in the system 100 and may be, e.g., a network on a chip (NoC), such as an ARM Advanced Microcontroller Bus Architecture (AMBA) Advanced eXtensible Interface (AXI). Each of the devices in the system 100 may be connected to the communications switch 102 through an interposer (not shown in FIG. 1).

The CPU cluster 104 includes processing cores for the system 100. The CPU cluster 104 may include, e.g., one or more ARM cores. The CPU cluster 104 may also include one or more Serializer/Deserializers (SerDes) for communication with the communications switch 102.

The hardware accelerators 106 may include any additional devices in the system 100, such as communications controllers, graphics processors, sound processors, cellular or networking controllers, and the like. While illustrated with the same reference numeral, it should be appreciated that the hardware accelerators 106 in the system 100 may include a variety of different accelerators.

The memory controller 108 facilitates efficient data access to the memory 110 by the CPU cluster 104 and the hardware accelerators 106. In some embodiments, the memory controller 108 may be, e.g., a shared memory controller (SMC). In such embodiments, the SMC may be in a master-slave system such that the CPU cluster 104 is configured to include one or more master CPUs, and the memory 110 is configured as slave memory.

The system 100 may be an existing system, or a new system that is being designed. When the system 100 is an existing system, traces may be provided or created that fully test and explore the system 100. In some embodiments, the system 100 is a new system that is based on an existing system. For example, the new system may be similar to the existing system except for a difference in the memory controller 108, e.g., the new system may have a SMC that is different from the old system. Embodiments allow traces produced for the existing SMC to be reused for simulating and testing the new SMC.

The blocks shown in the system 100 may be different intellectual property (IP) cores, and may be sourced from different designs or sources. Accordingly the blocks in the system 100 may have different trace formats. For example, the CPU cluster 104 may have a different trace format than the shared memory controllers 108; likewise, the hardware accelerators 106 may have different trace formats. Embodiments may define trace formats so that the different traces for the various blocks of the system 100 may be read and created in compliance with their specific format. In some embodiments, the trace formats are defined in a configuration file.

Figure 2:
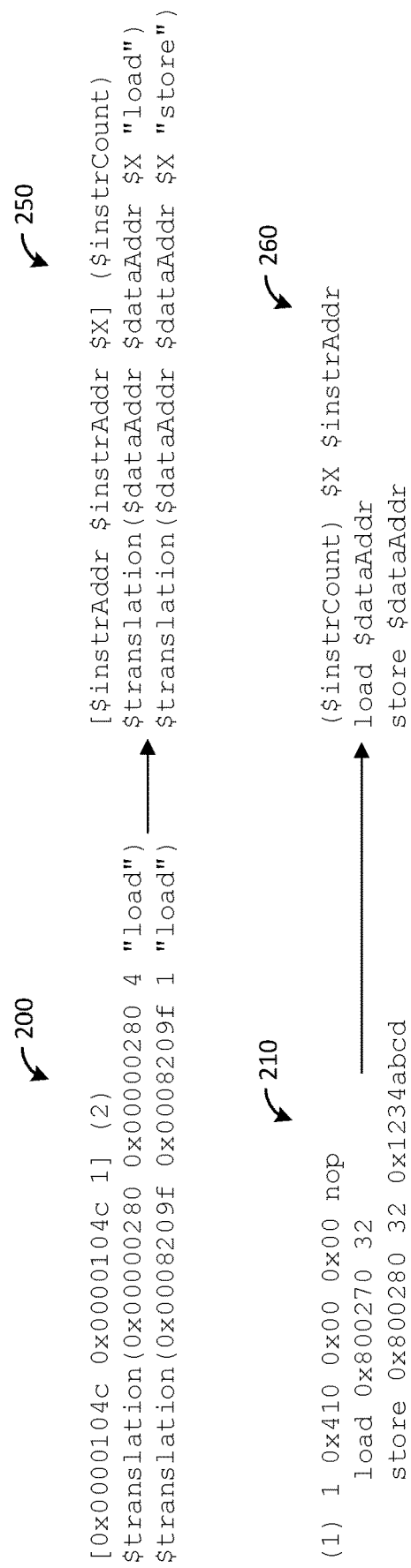
FIG. 2 shows pseudo code listings of two traces and their respective formats.

FIG. 2 shows pseudo code listings of two traces and their respective formats. FIG. 2 lists a first trace example 200 and a second trace example 210. As can be seen, the first trace example 200 and the second trace example 210 may perform similar operations (e.g., perform load and store commands), but differ in their particular syntax. FIG. 2 also lists a first trace format 250 and a second trace format 260, which correspond to the first trace example 200 and the second trace example 210, respectively. The first trace format 250 and the second trace format 260 have placeholder variables that indicate where parameters for the traces occur in each trace format. For example, the instrAddr parameter indicates the location of an instruction address, the dataAddr parameter indicates the location of a data address, the instrCount parameter indicates the instruction count for a trace, and the X parameter indicates symbols or values that should be ignored. While the example listings in FIG. 2 show particular trace formats and use specific variable names, it should be appreciated that any format and names could be used and may vary from instruction to instruction in a trace.

In some embodiments, new traces are produced by duplicating existing traces. For example, an existing trace may be a trace for a single-core system, while a newer system model may include multiple cores. Embodiments automatically generate traces for multiple core systems, taking into account local memory, shared memory, instruction memory, etc. Some embodiments duplicate an existing trace while remapping memory accesses operations into a different memory space. Remapping may include offsetting the data memory locations, instruction memory locations, and shared memory locations. Additionally, start times for the different traces may be randomized, which may help more accurately simulate a multi-core system.

Figure 3:
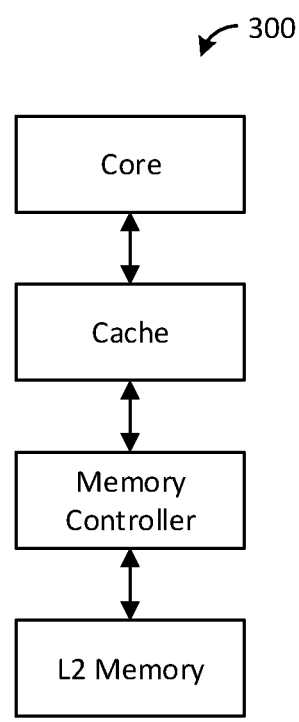
FIG. 3 is a diagram of a single-core system model under simulation.

FIG. 3 is a diagram of a single-core system model 300 under simulation. The single-core system model 300 includes one processor core that interacts with a memory controller. An existing trace for the single-core system model 300 may test all functionality of the single-core system model 300.

Figure 4A:
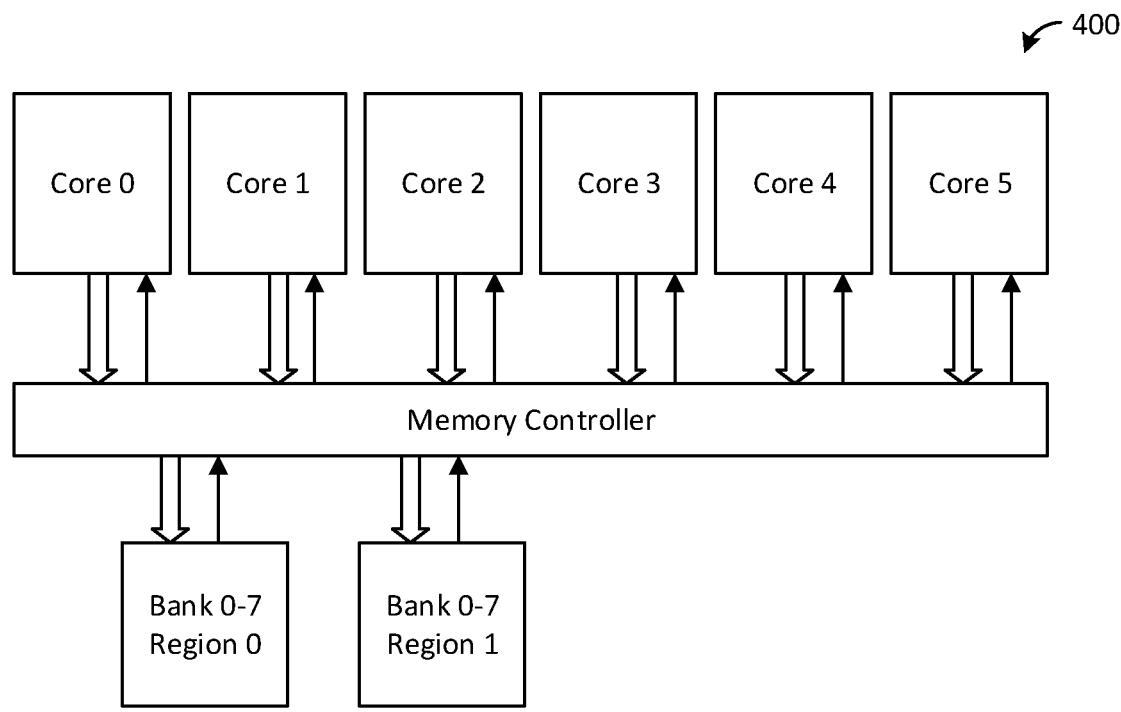
FIG. 4A is a diagram of a multi-core system model.

FIG. 4A is a diagram of a multi-core system model 400. The multi-core system model 400 may be, e.g., a 6-core 12-thread system model. The multi-core system model 400 may be a newer system for which traces are unavailable. Embodiments facilitate modification and reuse of the traces from the single-core system model 300 in the multi-core system model 400. The existing trace may be reused through duplication, compression, etc.

Figure 4B:
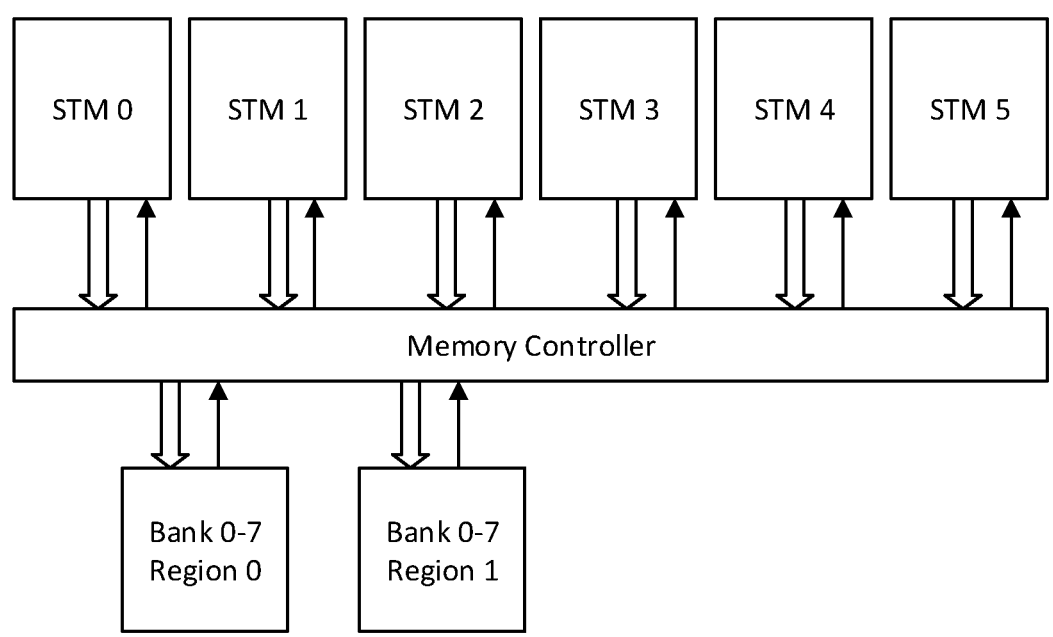
FIG. 4B illustrates a multi-core system model under simulation.

FIG. 4B illustrates the multi-core system model 400 under simulation using the traces derived from the traces for the single-core system model 300. As seen, each processing core in the multi-core system model 400 is being simultaneously simulated.

In some embodiments, new traces are produced by compressing existing traces. Compressing traces may allow existing traces to be used for simulations in a manner that more accurately targets specific areas of a system model for testing. Further, traces can be large. For example, a trace for a typical system may include more than 250,000 instructions, and a trace for a complex system has been observed to include up to 6 million instructions. Many of the instructions in a trace perform light and/or repetitive work, and such lengthy traces require extensive CPU time to simulate. Some embodiments analyze a trace to detect pertinent portions for simulation, removing unnecessary portions in order to reduce the simulation time without loss of simulation coverage. Pertinent portions generally include subsets of the trace that are relevant to the system performance, such as the memory subsystems or level-2 memory access operations.

FIG. 5 illustrates an example trace 500. The example trace 500 includes a segment of instructions, sometimes called a change-of-flow (COF) element 502. The COF element 502 includes a section of instructions starting at the beginning of the COF element 502 and ending at the instruction before a subsequent COF element occurs in the example trace 500.

Figure 6A:

FIG. 6A illustrates an example trace 600. The example trace 600 includes several COF elements 602, 604, 606, 608. As seen, the COF elements are sequentially organized in the trace.

A compressed trace may include several COF elements from the original trace, such that unnecessary jump instructions are eliminated, which may increase the speed of the simulation. The COF elements in the compressed trace includes complete loops or function calls, which makes simulation closer to realistic use cases. The size of COF elements varies. Some COF elements may contain as few as one instruction, while some COF element may contain up to about one hundred instructions.

Figure 6B:
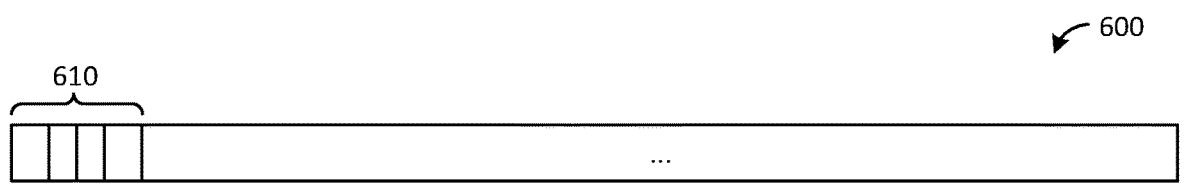
Figure 6C:

While the example trace 600 is illustrated with four COF elements, it should be appreciated that a trace may include more COF elements. For example, a trace for a Universal Mobile Telecommunications System (UMTS) system includes about 537,000 instructions, and includes about 85,000 COF elements. Given the size of a typical trace, compressing a trace based only on COF elements may be difficult and may itself require a large amount of processing power. In some embodiments, trace instruction segments are defined that include sets of contiguous COF elements. FIG. 6B illustrates the example trace 600 with the COF elements 602, 604, 606, 608 organized into an instruction segment 610. Instruction segments may be defined to include at least a specified number of instructions, e.g., 1000 instructions. As a result, instruction segments may be similar in size. FIG. 6C illustrates the example trace 600 with multiple instruction segments 610, 612, 614. Continuing the example above, the UMTS system trace with about 537,000 instructions may be organized to include about 532 instruction segments, with each segment having about 1000 instructions.

Figure 7A:
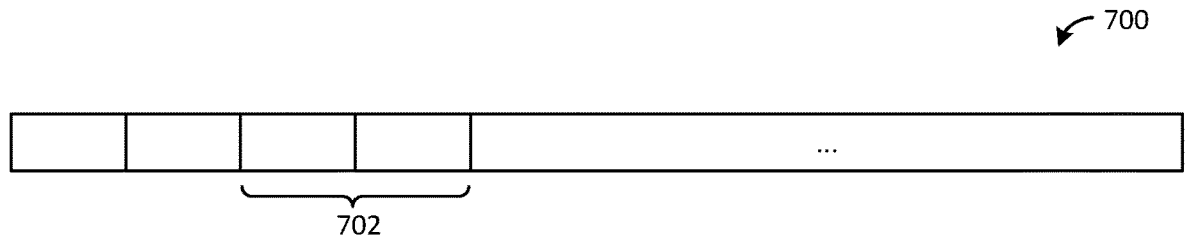

FIG. 7A illustrates trace compression according to a first embodiment. In such embodiments, traces are compressed with a continual compression technique. In a continual approach, a predefined minimum quantity of instructions 702 are extracted from an original trace 700. The instructions may be extracted according to a variety of selection criteria. For example, the instruction segments in the instructions 702 may be selected based on the density of load/store data access instructions in the segments, or may be selected based on a minimum quantity of data access instructions. The continual compression approach is relatively simple to implement.

Figure 7B:
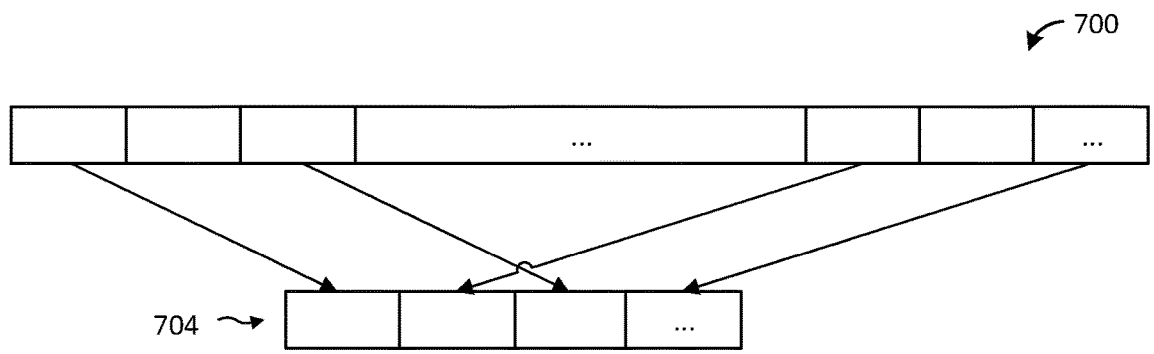

FIG. 7B illustrates trace compression according to a second embodiment. In such embodiments, traces are compressed with a segment swapping technique. In a swapping approach, traces are decomposed and rearranged into a trace that includes a reasonable number of instruction segments. Such embodiments allow a compressed trace to be created in a more flexible manner. For example, a compressed trace 704 may be created by selecting various instruction segments from different portions of the original trace 700. The selection criterion for instruction segments may be similar to that of the continual approach. Selection of particular instruction segments may allow the creation of a new, smaller trace that better represents the original trace 700.

Table 1 shows example average fetch latency results for simulations of original and compressed traces in the example UMTS system discussed above. The original trace for this system model was about 537,000 instructions, while the compressed trace was about 40,000 instructions, or about 92.5% smaller in size. The first column of Table 1 shows results for the original trace, while the second and third columns show results for the continual and swapping trace compression techniques. Each row shows results when simulating different quantities of threads and cores.

TABLE 1

Average fetch latencies for original and compressed simulations.

|  | Original | Continual | Swapping |
| --- | --- | --- | --- |
| 1 core, 1 thread | 22.36 | 23.15 | 23.18 |
| 1 core, 2 threads | 25.83 | 28.39 | 26.69 |
| 1 core, 6 threads | 26.32 | 27.82 | 26.94 |

As can be seen above in Table 1, the simulated latency of the original and compressed traces is generally comparable, showing that compressed traces can be good indicators of overall system performance and are similar to uncompressed traces in simulation accuracy. As shown, latency generally tends to increase with the addition of more cores and threads to the simulation as the amount of data flowing in the system typically increases with the quantities of cores/threads in the system.

Tables 2, 3, and 4 show average load latency, store latency, and load/store throughput, respectively, for simulations of original and compressed traces in the example UMTS system discussed above. As can be seen in Tables 2 and 3, the load and store latencies are generally comparable between the original and compressed traces, with the swapping technique producing results that are closer to the original trace than the continual technique. As shown in Table 4, load/store throughput is approximately comparable across all three traces.

TABLE 2

Average load latencies for original and compressed simulations.

|  | Original | Continual | Swapping |
| --- | --- | --- | --- |
| 1 core, 1 thread | 29.73 | 28.34 | 29.73 |
| 1 core, 2 threads | 38.53 | 36.26 | 38.78 |
| 6 cores, 12 threads | 38.99 | 37.03 | 39.58 |

TABLE 3

Average store latencies for original and compressed simulations.

|  | Original | Continual | Swapping |
| --- | --- | --- | --- |
| 1 core, 1 thread | 42.97 | 41.19 | 42.72 |
| 1 core, 2 threads | 59.38 | 55.08 | 59.35 |
| 6 cores, 12 threads | 60.05 | 56.72 | 60.81 |

TABLE 4

Average throughput for original and compressed simulations.

|  | Original | Continual | Swapping |
| --- | --- | --- | --- |
| 1 core, 1 thread | 3.114 | 3.179 | 3.202 |
| 1 core, 2 threads | 5.514 | 5.738 | 5.6 |
| 6 cores, 12 threads | 32.73 | 32.70 | 32.40 |

As can be seen above in Tables 2, 3, and 4, the simulated load/store latency of the original and compressed traces is generally comparable, showing that the compressed traces can be good indicators of overall system performance. Further, because the compressed traces are up to 90% smaller than the original traces, they require less CPU runtime to simulate.

While the discussion of FIG. 7A-7B and the example results shown in Tables 1-4 have been presented in the context of compressed traces, it should be appreciated that the traces could also have been produced through other techniques, such as duplication (discussed above with respect to FIGS. 4A-4B). For example, in some embodiments a trace for a single-core system model could be compressed, and then could be duplicated several times so that all threads of the 6-core 12-thread model may be tested.

In some embodiments, new traces are produced by generating entirely new traces instead of generating new traces through compression and/or cloning. New traces may be needed to, e.g., stress test a new system model. New traces are generated through a variety of techniques. New traces may be created by increasing the density of particular instructions, such as load and/or store instructions, in an existing trace. New traces may be created by randomizing memory access operations in a trace, such that different sections of private and shared memory are accessed by a new trace. New traces may be created by randomizing the sizes of data structures created and accessed in traces. New traces may be created by increasing the frequency of particular COF elements in an existing trace. Different kinds of created traces may be useful in testing certain kinds of subsystem. For example, a trace created by randomizing memory access operations may be useful for testing a memory controller subsystem model. The traces may be generated to simulate various levels of traffic intensity on such a memory controller subsystem before the controller is implemented in a new system.

To generate traces, COF elements are further organized into groups of COF elements, sometimes called COF groups. A COF group contains multiple COF elements that start with the same instruction memory address. Different COF groups may include a sufficient quantity of COF elements such that each COF group has approximately the same quantity of instructions. In some embodiments, a COF group may include all COF elements from a same or similar operation. For example, a COF group may include all COF elements from a particular iterative loop or function call in a trace.

Figure 8:
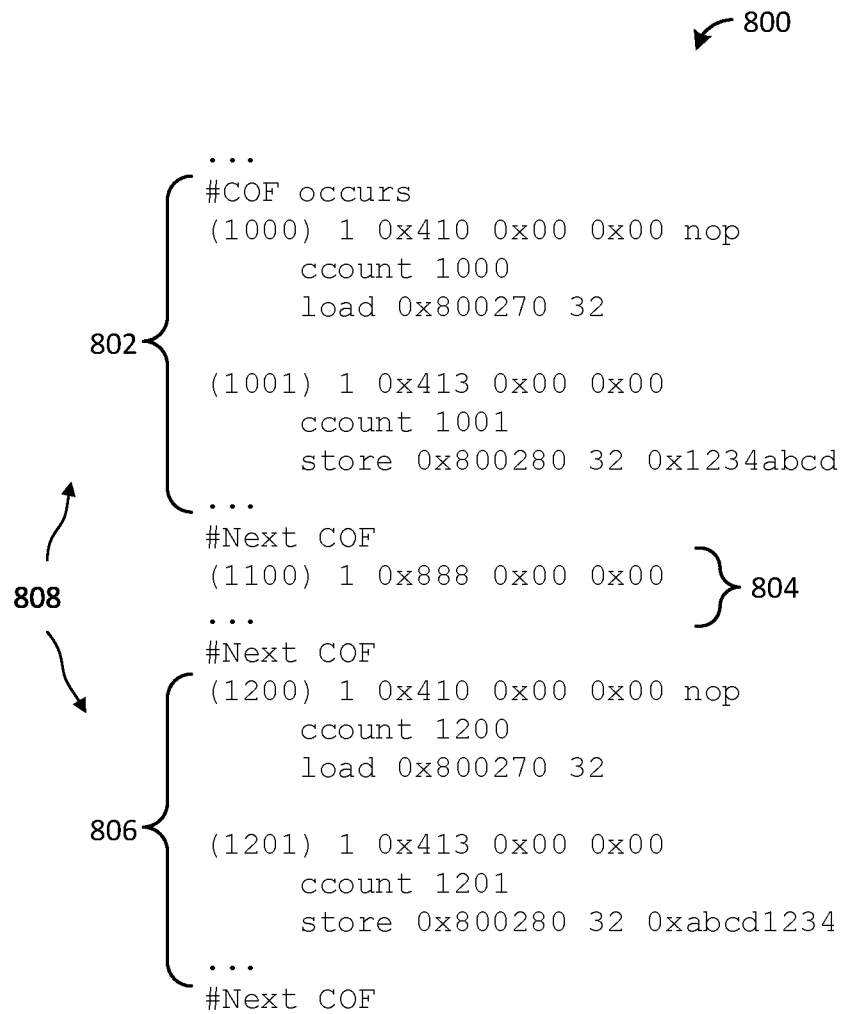

FIG. 8 illustrates an example trace 800. The example trace 800 includes COF elements 802, 804, 806, which occur sequentially in the example trace 800. The COF elements 802 and 806 begin with the same memory address (0x410), and have been organized into a COF group 808. Note that, because the COF element 804 begins with a different address (0x888), it has not been organized with the COF group 808. Continuing discussion of the above example UMTS trace, the original trace that included about 537,000 instructions may be organized into about 591 COF groups.

In some embodiments, after a trace is organized into COF groups, the COF groups may be analyzed to determine various attributes (sometimes collectively called heuristics) for the COF groups. For example, attributes for the COF groups may include the starting address of the COF elements in the groups, the first COF element from the groups in the original trace, traffic density in the groups, sizes of COF elements in the groups, and the total quantity of COF elements in the groups.

The COF group attributes may be used to generate various new traces for simulation and testing. The starting instruction address provides a reference or label for the COF elements of a COF group in a new trace. The first COF element in a COF group from the original trace may be used as a prototype element to generate instructions for the new trace. Traffic density is a useful criterion for selecting COF groups for generation of a new trace. The size of a COF element, e.g., the total quantity of instructions therein, is useful when generating a trace with a minimum quantity of instructions. The total quantity of COF elements in a group provides good guidance when determining a target occurrence rate of the COF group in the new trace.

When generating new traces, COF groups may be grouped into COF pools, and the traces generated by selecting a COF pool. COF groups may be pooled according to the attributes of the COF groups. For example, COF groups that meet particular criteria (e.g., minimum traffic density, minimum quantity of instructions, etc.) may be selected for a COF pool. Once COF groups are pooled, the COF groups in a selected pool are used to generate new traces.

Figure 9:
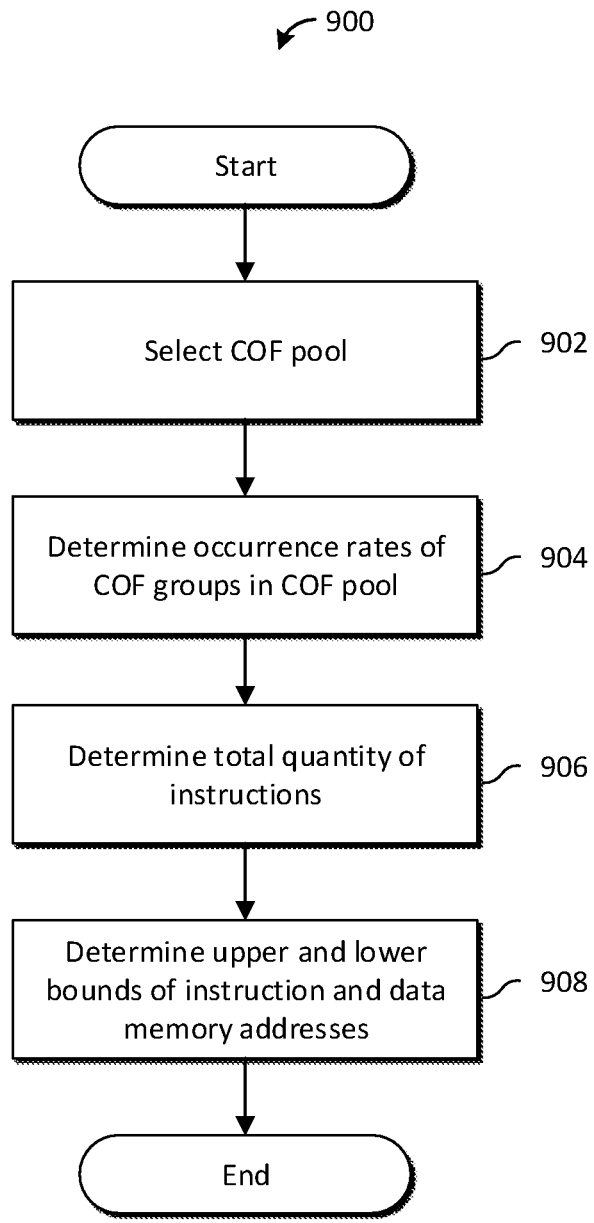
FIG. 9 illustrates a trace formation method.

FIG. 9 illustrates a trace formation method 900. The trace formation method 900 is indicative of operations when gathering information about COF groups in a selected COF pool before forming a new trace with the COF pool.

The trace formation method 900 begins by selecting a COF pool according to attributes of the COF groups in the pool (step 902). The attributes considered may include, e.g., traffic density, size of COF elements in the COF groups, and the like.

Next, the occurrence rate of each COF group (from the selected COF pool) in the new trace is determined (step 904). In some embodiments, occurrence statistics for the COF groups in the new trace may be selected such that they are similar to occurrence statistics for the COF groups in the original trace. The occurrence rate of the COF groups in the new trace could be determined according to other considerations. In some embodiments, the occurrence rates of COF groups with smaller COF elements may be increased so that the instruction cache miss rate of the new trace is increased. Such embodiments may allow new traces to be generated such that they target areas of particular interest or high traffic in the system under simulation.

Next, the total quantity of instructions in the new trace is determined (step 906). The total quantity of instructions may be a target value, such that new trace includes a quantity of instructions that is not less than the target value. The target value may constrain the quantity and size of COF groups selected from the COF pool to form the new traces.

Finally, the upper and lower bounds of instruction and data memory addresses for new traces is determined (step 908). Each subsystem (e.g., core, thread, etc.) in a model may be simulated with its own instruction and/or data memory spaces, which the simulation should conform to. Accordingly, the range of memory addresses may be determined for each subsystem, then the new instructions and the associated data are generated within that range.

Figure 10:
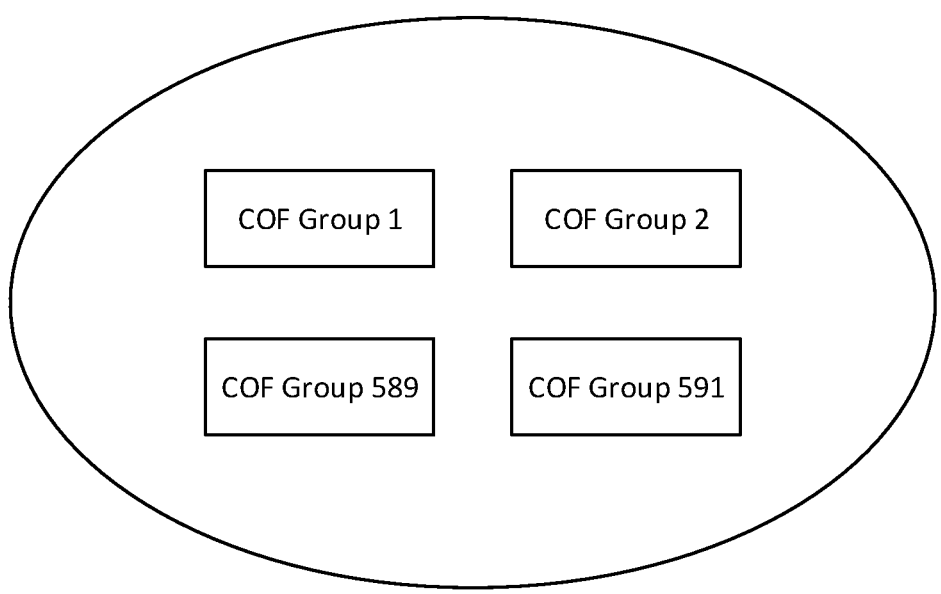
FIG. 10 illustrates a COF pool.

FIG. 10 illustrates a COF pool from the example UMTS trace discussed above. The example COF pool includes COF groups 1, 2, 589, 591. The COF groups in the example COF pool have been selected from an original trace according to the attributes of the COF groups (discussed above with respect to the trace formation method 900). Table 5 illustrates some example attributes of the COF groups from the original trace. Each column of Table 5 represents one COF group in the original trace. Each row of Table 5 represents an attribute for the COF group in the original trace.

TABLE 6

Occurrence rates for COF groups in a new trace.

|  | COF Group 1 | COF Group 2 | COF Group 589 | COF Group 591 |
| --- | --- | --- | --- | --- |
| Traffic Density | 2 | 0.879 | 1.333 | 0.938 |
| Occurrence Rate | 2 | 4 | 1 | 2 |

In the example illustrated in FIG. 10, the occurrence rate of the COF groups in the new trace are selected such that they are proportional to the total quantity of COF elements each COF group contains in the original trace.

Figure 11:
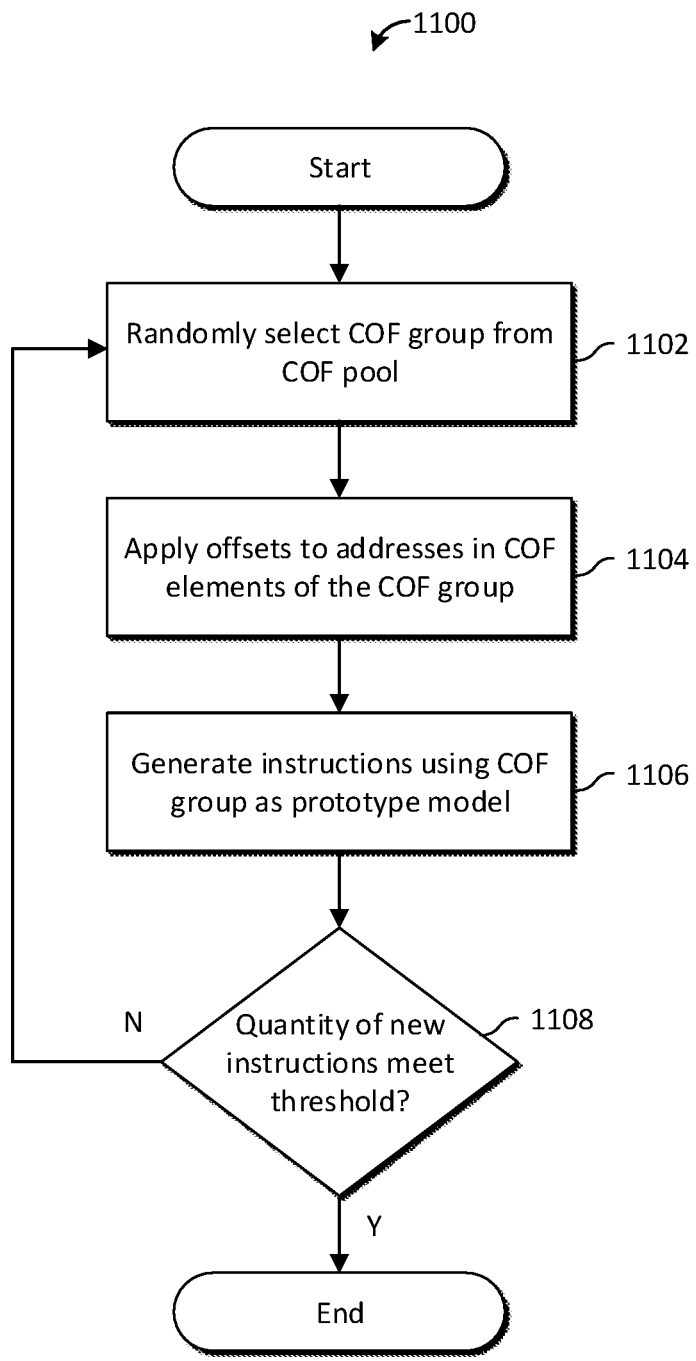
FIG. 11 illustrates a trace formation method.

FIG. 11 illustrates a trace formation method 1100. The trace formation method 1100 is indicative of operations when generating a new trace from COF groups in a selected COF pool.

First, a COF group is randomly selected from the selected COF pool (step 1102). In some embodiments, the COF groups are selected based on their occurrence rates in the COF pool. Selecting COF groups for a new trace based on occurrence rates in the original COF pool may result in the new traces and the original traces following similar trends. In some embodiments, COF groups may be randomly selected according to other criterion The COF groups may be selected until the occurrence rates of COF groups in the new trace match or are close to a target rate.

Next, offsets are applied to the instruction and data memory addresses of COF elements in each selected COF group (step 1104). The offsets may be randomly or deterministically selected. In some embodiments the offsets may be chosen uniformly from a range of potential memory addresses. In some embodiments, the offsets may be selected from a probability model such as a normal distribution. In some embodiments, the offsets may be set to a constant value.

Next, instructions for the new trace are generated using the COF group as a prototype model, with the chosen offsets applied to memory addresses in the COF group (step 1106). A new trace is generated by creating new COF elements corresponding to COF elements in the selected COF group. When the instructions are generated from the selected COF

TABLE 5

Attributes of COF groups in an original trace.

|  | COF Group 1 | COF Group 2 | COF Group 3 | COF Group 4 | ... | COF Group 589 | COF Group 590 | COF Group 591 |
| --- | --- | --- | --- | --- | --- | --- | --- | --- |
| Traffic Density | 2 | 0.879 | 0.75 | 0.666 | ... | 1.333 | 0.564 | 0.938 |
| Total COF Elements | 179 | 366 | 368 | 354 | ... | 80 | 27 | 168 |
| Size of COF elements | 1 | 33 | 8 | 21 | ... | 3 | 55 | 16 |

In the example illustrated in FIG. 10, COF groups 1, 2, 589, 591 are selected from the original trace according to magnitude of their traffic densities, e.g., the 4 COF groups with the highest densities were selected. Table 6 illustrates attributes of the COF groups 1, 2, 589, 591 in the example COF pool, along with the occurrence rates for the COF groups.

group, memory addresses within the instructions are selected such that their values are within the upper and lower bounds for the COF group (determined above in step 908). In some embodiments, instruction address range of the new COF elements are adjusted such that they do not overlap with instruction addresses of existing COF elements unless both address ranges completely coincide. Producing traces with non-overlapping instruction address ranges may more accurately reflect real-world usage patterns during simulation.

Finally, if the total quantity of generated instruction is less than a preset threshold (step 1108), another COF group is randomly selected and steps 1102-1106 are repeated until the total quantity of new instructions is greater than or equal to the preset threshold. If the quantity of instructions meets or exceeds the present threshold, the method concludes.

New traces generated according to embodiment techniques may have higher miss rates when simulated. Higher miss rates may be expected in embodiments where offsets are added to instruction and data addresses during generation of the new trace. Higher load or store miss rates can be expected in embodiments where COF groups with a higher quantity of load and store instructions are used to generate the new trace.

Different embodiment techniques can be used to create traces for various tests. For example, selecting a pool of COF groups with higher traffic densities can result in a more stressful test. Selecting a pool of COF groups with small sizes of COF elements may increase the instruction cache miss rate, as the data in the cache is updated more frequently.

In some embodiments, new traces are synthesized for future system models. Synthesis can provide an automated scheme for generating new traces for wider stress testing coverage, including generating traces for testing corner cases or particular scenarios. Synthesis may be extended to inject faults in a trace, e.g., invalid memory ownership, random noise transactions, etc. Such synthesis may provide simulation scenarios that are less than ideal, allowing for shorter traces and more specific targeting of corner cases and combinations of different scenarios. Once the new traces are synthesized, the new system model may be simulated with the new traces. In some embodiments, the trace results may be used to modify or optimize the new system model. Once the new system model has been simulated, tested, and finalized, a device may be designed and manufactured using the new system model.

Figure 12A:
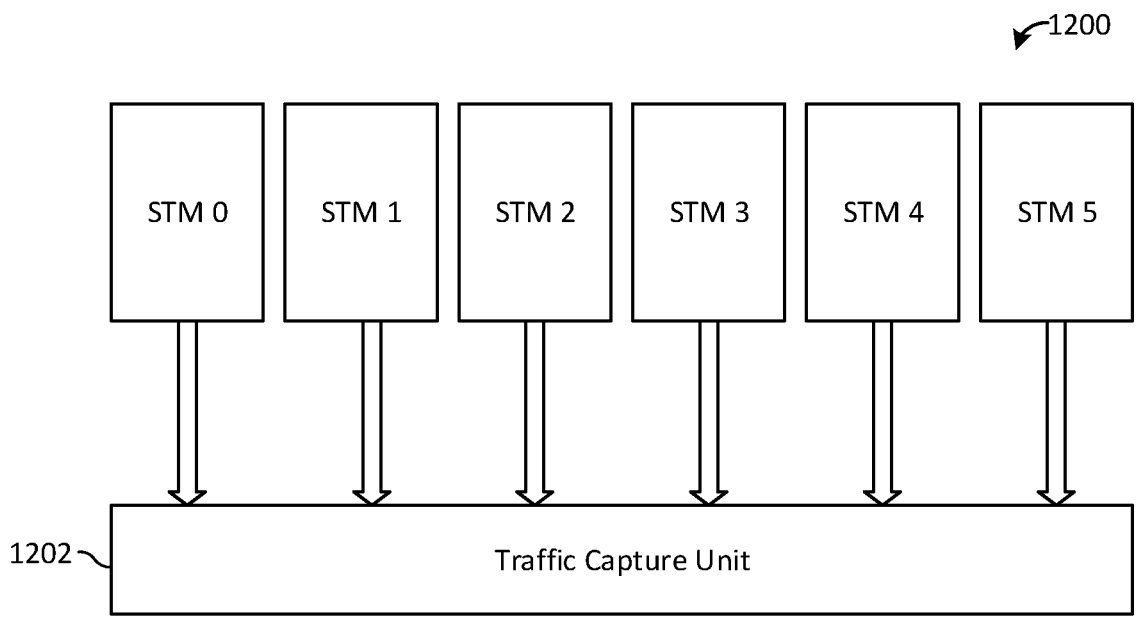
FIGS. 12A-12B illustrate synthesis of traces for use on future models.
Figure 12B:
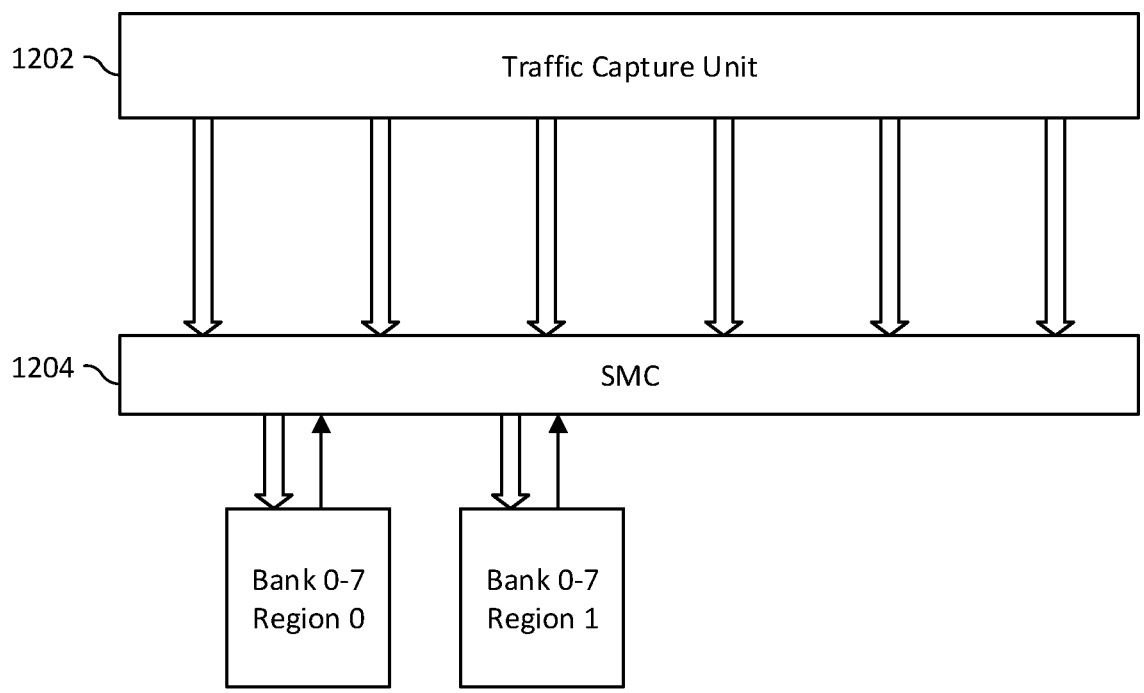

FIGS. 12A-12B illustrate synthesis of traces for use on future models. In FIG. 12A, new traces are created (through compression and cloning), and then simulated on a system model 1200, which is a multi-core system. Operations by the system model 1200 that access a SMC may be intercepted by a traffic capture unit 1202. The traces that are intercept by the traffic capture unit 1202 may then be used to generate traffic for testing new features of an SMC under development. In FIG. 12B, the captured traces are used by the traffic capture unit 1202 to test a new SMC 1204. By abstracting away cores and caches from the new SMC 1204, e.g., through read/write transactions, more thorough testing coverage of the new SMC 1204 may be achieved compared to running simulations on a full system. Traces may be synthesized with key characteristics that are derived from design requirements of a system under development, using information currently available for simulation and testing of the system of interest. Once these criteria are available, the traces may then be generated using techniques discussed above (e.g., cloning and compressing existing traces).

In some embodiments, traces are synchronized among one another to simulate sequential dependence in a multi-core system model. Such synchronization can simulate scenarios where execution of a data pipeline on a first core must hold or sleep while waiting for a second core to complete another task. Wait instructions with various conditions may be generated and injected when creating new traces.

Figure 13:
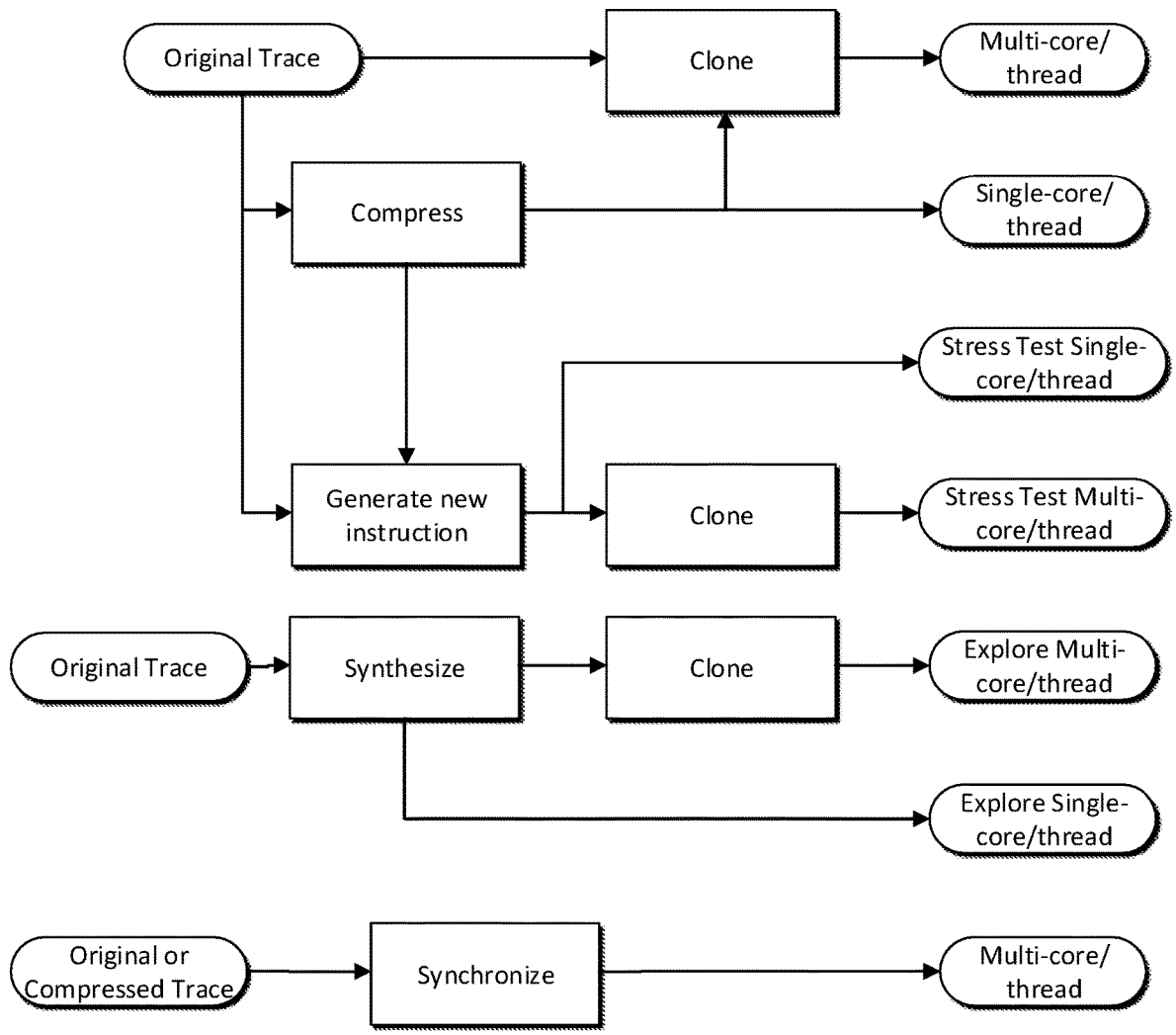
FIG. 13 illustrates manners in which trace creation techniques may be combined.

While the above discussion has individually described particular techniques for generating traces, it should be appreciated that the described embodiments may be used to produce traces using combinations of various techniques. FIG. 13 illustrates some manners in which trace creation techniques may be combined. For example, traces may be produced through different combinations of compression, cloning, and/or generation. Synthesis may be used on its own or implemented with cloning. Likewise, synchronization may be used on its own or implemented with cloning. It should be appreciated that FIG. 13 depicts a non-limiting example, and other combinations may also be used.

Figure 14:
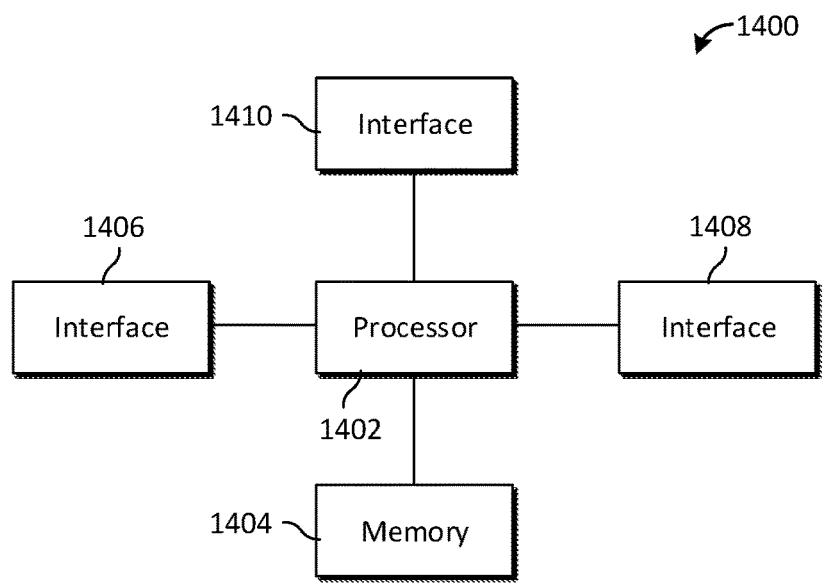
FIG. 14 illustrates a diagram of an embodiment processing system.

FIG. 14 illustrates a block diagram of an embodiment processing system 1400 for performing methods described herein, which may be installed in a host device. As shown, the processing system 1400 includes a processor 1402, a memory 1404, and interfaces 1406-1410, which may (or may not) be arranged as shown in FIG. 14. The processor 1402 may be any component or collection of components adapted to perform computations and/or other processing related tasks, and the memory 1404 may be any component or collection of components adapted to store programming and/or instructions for execution by the processor 1402. In an embodiment, the memory 1404 includes a non-transitory computer readable medium. The interfaces 1406, 1408, 1410 may be any component or collection of components that allow the processing system 1400 to communicate with other devices/components and/or a user. For example, one or more of the interfaces 1406, 1408, 1410 may be adapted to communicate data, control, or management messages from the processor 1402 to applications installed on the host device and/or a remote device. As another example, one or more of the interfaces 1406, 1408, 1410 may be adapted to allow a user or user device (e.g., personal computer (PC), etc.) to interact/communicate with the processing system 1400. The processing system 1400 may include additional components not depicted in FIG. 14, such as long term storage (e.g., non-volatile memory, etc.).

In some embodiments, the processing system 1400 is included in a network device that is accessing, or part otherwise of, a telecommunications network. In one example, the processing system 1400 is in a network-side device in a wireless or wireline telecommunications network, such as a base station, a relay station, a scheduler, a controller, a gateway, a router, an applications server, or any other device in the telecommunications network. In other embodiments, the processing system 1400 is in a user-side device accessing a wireless or wireline telecommunications network, such as a mobile station, a user equipment (UE), a personal computer (PC), a tablet, a wearable communications device (e.g., a smartwatch, etc.), or any other device adapted to access a telecommunications network.

Figure 15:
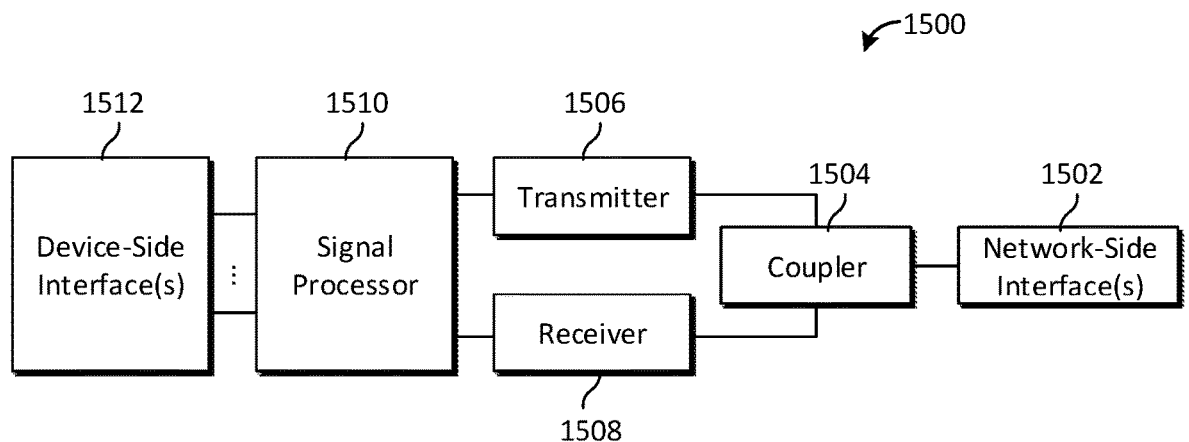
FIG. 15 illustrates a block diagram of a transceiver.

In some embodiments, one or more of the interfaces 1406, 1408, 1410 connects the processing system 1400 to a transceiver adapted to transmit and receive signaling over the telecommunications network. FIG. 15 illustrates a block diagram of a transceiver 1500 adapted to transmit and receive signaling over a telecommunications network. The transceiver 1500 may be installed in a host device. As shown, the transceiver 1500 comprises a network-side interface 1502, a coupler 1504, a transmitter 1506, a receiver 1508, a signal processor 1510, and a device-side interface 1512. The network-side interface 1502 may include any component or collection of components adapted to transmit or receive signaling over a wireless or wireline telecommunications network. The coupler 1504 may include any component or collection of components adapted to facilitate bi-directional communication over the network-side interface 1502. The transmitter 1506 may include any component or collection of components (e.g., up-converter, power amplifier, etc.) adapted to convert a baseband signal into a modulated carrier signal suitable for transmission over the network-side interface 1502. The receiver 1508 may include any component or collection of components (e.g., down-converter, low noise amplifier, etc.) adapted to convert a carrier signal received over the network-side interface 1502 into a baseband signal. The signal processor 1510 may include any component or collection of components adapted to convert a baseband signal into a data signal suitable for communication over the device-side interface(s) 1512, or vice-versa. The device-side interface(s) 1512 may include any component or collection of components adapted to communicate data-signals between the signal processor 1510 and components within the host device (e.g., the processing system 1400, local area network (LAN) ports, etc.).

The transceiver 1500 may transmit and receive signaling over any type of communications medium. In some embodiments, the transceiver 1500 transmits and receives signaling over a wireless medium. For example, the transceiver 1500 may be a wireless transceiver adapted to communicate in accordance with a wireless telecommunications protocol, such as a cellular protocol (e.g., long-term evolution (LTE), etc.), a wireless local area network (WLAN) protocol (e.g., Wi-Fi, etc.), or any other type of wireless protocol (e.g., Bluetooth, near field communication (NFC), etc.). In such embodiments, the network-side interface 1502 comprises one or more antenna/radiating elements. For example, the network-side interface 1502 may include a single antenna, multiple separate antennas, or a multi-antenna array configured for multi-layer communication, e.g., single input multiple output (SIMO), multiple input single output (MISO), multiple input multiple output (MIMO), etc. In other embodiments, the transceiver 1500 transmits and receives signaling over a wireline medium, e.g., twisted-pair cable, coaxial cable, optical fiber, etc. Specific processing systems and/or transceivers may utilize all of the components shown, or only a subset of the components, and levels of integration may vary from device to device.

It should be appreciated that one or more steps of the embodiment methods provided herein may be performed by corresponding units or modules. For example, a signal may be transmitted by a transmitting unit or a transmitting module. A signal may be received by a receiving unit or a receiving module. A signal may be processed by a processing unit or a processing module. Other steps may be performed by a generating unit/module, an executing unit/module, an evaluating unit/module, a duplicating unit/module, a grouping unit/module, a remapping unit/module, a combining unit/module, a dividing unit/module, a determining unit/module, a reducing unit/module, a deriving unit/module, an analyzing unit/module, a generating unit/module, a synthesizing unit/module, an observing unit/module, a selecting unit/module, an appending unit/module, an organizing unit/module, an unit/module, a adjusting unit/module, and/or setting unit/module. The respective units/modules may be hardware, software, or a combination thereof. For instance, one or more of the units/modules may be an integrated circuit, such as field programmable gate arrays (FPGAs) or application-specific integrated circuits (ASICs).

Although the description has been described in detail, it should be understood that various changes, substitutions and alterations can be made without departing from the spirit and scope of this disclosure as defined by the appended claims. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed:

1. A method comprising:
   providing a first system model, the first system model comprising a plurality of subsystem models, each of the plurality of subsystem models having a trace format;
   generating a first plurality of traces from an overall pool of trace instructions, each of the first plurality of traces generated for respective ones of the plurality of subsystem models, according to the trace format of the subsystem model, the generating the first plurality of traces comprising compressing a subset of the overall pool of trace instructions by:
   dividing the overall pool of trace instructions into a plurality of change-of-flow (COF) elements;
   combining contiguous COF elements to produce a plurality of instruction segments;
   determining a subset of the plurality of instruction segments most relevant to performance of the first system model; and
   reducing the plurality of instruction segments to the subset most relevant to performance;
   executing the traces on each of the subsystem models; and
   evaluating execution characteristics for each trace executed on the first system model.

2. The method of claim 1, wherein generating the first plurality of traces further comprises duplicating a subset of the overall pool of trace instructions.

3. The method of claim 2, wherein duplicating the subset of the overall pool of trace instructions comprises:
   generating a first trace from the overall pool of trace instructions;
   duplicating the first trace to produce a second trace;
   remapping memory access operations of the second trace to a different memory space than memory access operations of the first trace; and
   combining the first trace and the second trace to produce the first plurality of traces.

4. The method of claim 1, wherein:
   each of the COF elements comprises a complete operation for one of the subsystem models;
   each instruction segment of the plurality of instruction segments includes approximately a same quantity of trace instructions; and
   each instruction segment of the plurality of instruction segments includes at least a pre-specified minimum quantity of trace instructions.

5. The method of claim 1, wherein reducing the plurality of instruction segments comprises selecting contiguous instruction segments from the subset of the plurality of instruction segments that meet a selection criterion.

6. The method of claim 1, wherein reducing the plurality of instruction segments comprises swapping the instruction segments from the subset of the plurality of instruction segments.

7. The method of claim 1, wherein generating the first plurality of traces further comprises generating new instructions.

8. The method of claim 7, wherein generating the new instructions comprises:
deriving a plurality of COF groups from the overall pool of trace instructions, each of the COF groups including a plurality of COF elements, each of the COF elements for a COF group starting with a same instruction memory address, each of the COF elements comprising a complete operation for one of the subsystem models;
analyzing heuristics of each of the COF groups; and
generating the traces according to the heuristics of the COF groups by selecting one or more of the COF groups and modifying instructions or data memory addresses in the COF elements of the one or more of the COF groups.

9. The method of claim 8, wherein analyzing the heuristics of each of the COF groups comprises determining, for each COF group of the COF groups, a density of store and/or load instructions in the COF group.

10. The method of claim 8, wherein analyzing the heuristics of each of the COF groups comprises determining, for each COF group of the COF groups, sizes of the COF elements in the COF group.

11. The method of claim 8, wherein analyzing the heuristics of each of the COF groups comprises determining, for each COF group of the COF groups, a quantity of COF elements in the COF group.

12. The method of claim 1, wherein generating the first plurality of traces comprises:
producing a plurality of unsynchronized traces; and
synchronizing among multiple ones of the plurality of unsynchronized traces.

13. The method of claim 1, further comprising synthesizing one or more new traces to add to the first plurality of traces.

14. The method of claim 1, wherein evaluating the execution characteristics for each trace comprises observing one of latency, throughput, cache miss rate, workload overhead, memory subsystem (MSS) utilization, or peak to average power ratio in the first system model, while executing the trace on each of the subsystem models.

15. The method of claim 1, further comprising:
producing a second system model based on the first system model;
generating a second plurality of traces for the second system model from the first plurality of traces, the second plurality of traces generated according to predetermined design requirements for the second system model; and
executing the second plurality of traces with the second system model.

16. A method comprising:
providing a system model comprising a plurality of subsystem models;
dividing an overall pool of trace instructions for the system model into a plurality of change-of-flow (COF) elements, each of the COF elements including a subset of the overall pool of trace instructions, each of the COF elements comprising a complete operation for one of the subsystem models;
grouping the plurality of COF elements into a plurality of COF groups, each of the COF elements in a COF group starting with a same instruction memory address and including a same quantity of instructions;
selecting at least one COF group of the plurality of COF groups;
producing new COF elements by adding a random or deterministic offset to instructions or data memory addresses in the plurality of COF elements in the at least one COF group;
combining the new COF elements to produce a new trace;
selecting another COF group of the plurality of COF groups;
producing additional new COF elements from the another COF group;
appending the additional new COF elements to the new trace;
repeating the selecting another COF group, the producing additional new COF elements, and the appending, until a total quantity of instructions of the new trace is greater than or equal to a predetermined value; and
executing the new trace with the plurality of subsystem models.

17. The method of claim 16, wherein selecting the at least one COF group comprises:
organizing the plurality of COF groups into pools of COF groups according to one of traffic density or size of COF elements in each of the plurality of COF groups;
selecting one of the pools of COF groups; and
adjusting occurrence rates of COF groups in each of the pools of COF groups.

18. The method of claim 17, wherein adjusting occurrence rates comprises:
evaluating occurrence rates of each COF group in the overall pool of trace instructions; and
setting the occurrence rates of each COF group in the selected pool of COF groups according to the occurrence rates of each COF group in the overall pool of trace instructions.

19. A device comprising:
a processor; and
a computer-readable storage medium storing a program to be executed by the processor, the program including instructions for:
providing a first system model, the first system model comprising a plurality of subsystem models, each of the plurality of subsystem models having a trace format;
generating a first plurality of traces from an overall pool of trace instructions, each of the first plurality of traces generated for respective ones of the plurality of subsystem models, according to the trace format of the subsystem model, the generating the first plurality of traces comprising compressing a subset of the overall pool of trace instructions by:
dividing the overall pool of trace instructions into a plurality of change-of-flow (COF) elements;
combining contiguous COF elements to produce a plurality of instruction segments;
determining a subset of the plurality of instruction segments most relevant to performance of the first system model; and
reducing the plurality of instruction segments to the subset most relevant to performance;
executing the traces on each of the subsystem models; and
evaluating execution characteristics for each trace executed on the first system model.

20. The device of claim 19, wherein reducing the plurality of instruction segments comprises selecting contiguous instruction segments from the subset of the plurality of instruction segments that meet a selection criterion.

21. The device of claim 19, wherein reducing the plurality of instruction segments comprises swapping the instruction segments from the subset of the plurality of instruction segments.

22. A device comprising:
   a processor; and
   a computer-readable storage medium storing a program to be executed by the processor, the program including instructions for:
      providing a system model comprising a plurality of subsystem models;
      dividing an overall pool of trace instructions for the system model into a plurality of change-of-flow (COF) elements, each of the COF elements including a subset of the overall pool of trace instructions, each of the COF elements comprising a complete operation for one of the subsystem models;
      grouping the plurality of COF elements into a plurality of COF groups, each of the COF elements in a COF group starting with a same instruction memory address and including a same quantity of instructions;
      selecting at least one COF group of the plurality of COF groups;
      producing new COF elements by adding a random or deterministic offset to instructions or data memory addresses in the plurality of COF elements in the at least one COF group;
      combining the new COF elements to produce a new trace;
      selecting another COF group of the plurality of COF groups;
      producing additional new COF elements from the another COF group;
      appending the additional new COF elements to the new trace;
      repeating the selecting another COF group, the producing additional new COF elements, and the appending the additional new COF elements, until a total quantity of instructions of the new trace is greater than or equal to a predetermined value; and
      executing the new trace with the plurality of subsystem models.

23. The device of claim 22, wherein selecting the at least one COF group comprises:
   organizing the plurality of COF groups into pools of COF groups according to one of traffic density or size of COF elements in each of the plurality of COF groups;
   selecting one of the pools of COF groups; and
   adjusting occurrence rates of COF groups in each of the pools of COF groups.

* * * * *